United States Patent
Kuwahara

(10) Patent No.: US 9,818,705 B1
(45) Date of Patent: Nov. 14, 2017

(54) SEMICONDUCTOR DEVICE

(71) Applicant: KABUSHIKI KAISHA TOSHIBA, Tokyo (JP)

(72) Inventor: Yoshimitsu Kuwahara, Himeji Hyogo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/447,121

(22) Filed: Mar. 2, 2017

(30) Foreign Application Priority Data

Sep. 15, 2016 (JP) ................... 2016-180689

(51) Int. Cl.
| | |
|---|---|
| *H01L 23/053* | (2006.01) |
| *H01L 23/00* | (2006.01) |
| *H01L 23/047* | (2006.01) |
| *H01L 25/065* | (2006.01) |
| *H01L 23/367* | (2006.01) |

(52) U.S. Cl.
CPC .......... *H01L 23/562* (2013.01); *H01L 23/047* (2013.01); *H01L 23/3675* (2013.01); *H01L 25/0655* (2013.01)

(58) Field of Classification Search
CPC ....... H01L 23/053; H01L 23/18; H01L 23/08; H01L 23/3675; H01L 25/072
See application file for complete search history.

(56) References Cited

U.S. PATENT DOCUMENTS

| | | |
|---|---|---|
| 5,598,036 A | 1/1997 | Ho |
| 8,456,001 B2 | 6/2013 | Taguchi et al. |
| 2016/0111554 A1 | 4/2016 | Kuwahara et al. |
| 2016/0247736 A1* | 8/2016 | Kuwahara ............... H01L 23/62 |

FOREIGN PATENT DOCUMENTS

JP    2013-149762 A    8/2013

\* cited by examiner

*Primary Examiner* — Mark Prenty
(74) *Attorney, Agent, or Firm* — Patterson & Sheridan, LLP

(57) ABSTRACT

A semiconductor device includes at least one semiconductor element having a first terminal side and a second terminal side connected by an outer periphery portion, a first terminal on the first terminal side, and a second terminal on the second terminal side. The device includes a frame surrounding the outer periphery portion of the semiconductor element. A first electrode is on the first terminal side and is electrically connected to the first terminal. The first electrode includes a first body portion and a first projection protruding outwardly therefrom around the circumference of the first body portion. A second electrode is on the second terminal side and is electrically connected to the second terminal, and a metal plate is over the first electrode. The first projection of the first electrode is spaced from and extends along a peripheral portion of the metal plate.

20 Claims, 2 Drawing Sheets

SEMICONDUCTOR DEVICE

CROSS-REFERENCE TO RELATED APPLICATION

This application is based upon and claims the benefit of priority from Japanese Patent Application No. 2016-180689, filed Sep. 15, 2016, the entire contents of which are incorporated herein by reference.

FIELD

Embodiments described herein relate generally to a semiconductor device.

BACKGROUND

A press-pack semiconductor device is used for a system having a large current applied thereto, such as an industrial inverter, a fan and a pump driving device. When some defects occur in a semiconductor chip provided in the semiconductor device, the semiconductor chip may burst. The broken pieces of the semiconductor chip may damage the semiconductor device accommodating the semiconductor chip resulting in pieces of the semiconductor chip being ejected from the device and damaging other devices.

DETAILED DESCRIPTION

An exemplary embodiment provides a semiconductor device capable of suppressing damage resulting from failure of a semiconductor chip within the semiconductor device.

In general, according to one embodiment, a semiconductor device includes at least one semiconductor element having a first terminal side and a second terminal side connected by an outer periphery portion, a first terminal on the first terminal side, and a second terminal on the second terminal side. The device includes a frame surrounding the outer periphery portion of the semiconductor element. A first electrode is on the first terminal side and is electrically connected to the first terminal. The first electrode includes a first body portion and a first projection protruding outwardly therefrom around the circumference of the first body portion. A second electrode is on the second terminal side and is electrically connected to the second terminal, and a metal plate is over the first electrode. The first projection of the first electrode is spaced from and extends along a peripheral portion of the metal plate.

Hereinafter, embodiments will be described with reference to the drawings.

The drawings are schematic and conceptual and the relationships of thickness and width of each element and the ratio of sizes of each element do not always represent those in an actual device. Even if an identical portion of an element is illustrated, the dimensions and the ratio of sizes of each element may be shown differently in each drawing.

The same reference symbols are attached to the same elements that have been already described in the specification and the drawings and their detailed description is omitted where appropriate.

The xyz orthogonal coordinate system is used for the description of the embodiments. The direction from a lower electrode 20 to an upper electrode 24 is defined as the Z direction (first direction) and two mutually orthogonal directions at right angles with respect to the Z direction are defined as the X direction and the Y direction.

Figure 1A:
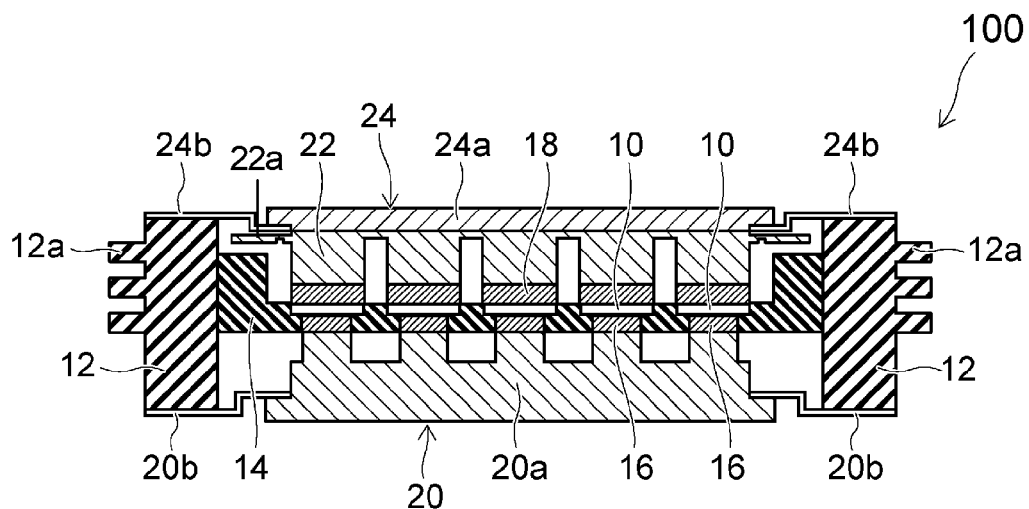
FIGS. 1A and 1B are cross-sectional views of a semiconductor device according to an embodiment.
Figure 1B:

FIGS. 1A and 1B are cross-sectional views of a semiconductor device 100 according to the embodiment.

FIG. 1A shows, in section, the entire semiconductor device 100, and FIG. 1B shows a semiconductor chip 10 which is provided in the semiconductor device 100.

The semiconductor device 100 is, for example, a press-pack Injection Enhanced IGBT (IEGT) including a plurality of semiconductor chips.

As shown in FIG. 1A, the semiconductor device 100 includes a semiconductor chip 10, a housing 12 (frame), a resin frame 14, heat compensation plates 16 and 18, the lower electrode 20 (second electrode), a metal plate 22, and the upper electrode 24 (first electrode).

As shown in FIG. 1B, the semiconductor chip 10 includes an upper terminal 10a (first terminal), a lower terminal 10b (second terminal) opposite to the upper terminal 10a, and a semiconductor portion 10c between the upper terminal 10a and the lower terminal 10b.

The semiconductor chip 10 is, for example, a silicon based IEGT using silicon. The IEGT is an Insulated Gate Bipolar Transistor (IGBT) having an electron injection promoting effect. When the semiconductor chip 10 is an IEGT, the upper terminal 10a serves as an emitter electrode and the lower terminal 10b serves as a collector electrode. In this case, the semiconductor chip 10 further includes a gate electrode (not illustrated).

The semiconductor chip 10 may be a device other than the IEGT so long as it includes electrodes that are arranged in the vertical direction, i.e., accessible on opposed sides of the semiconductor chip 10. The semiconductor chip 10 may be, for example, a diode such as Fast Recovery Diode (FRD) or a Metal Oxide Semiconductor Field Effect Transistor (MOSFET). Alternatively, a portion of the plural semiconductor chips 10 provided in the semiconductor device 100 may be IEGTs and the others may be diodes. Alternatively, the semiconductor chip 10 may be a silicon carbide based device rather than a silicon based device.

The housing 12 has an annular shape and it surrounds the outer periphery of the semiconductor chip 10. The housing 12 is made of an insulating ceramic such as alumina. A plurality of annularly shaped projections 12a are provided around, and extend radially outwardly at, the outer periphery of the housing 12. Provision of the projections 12a improves the insulation performance (creepage distance, i.e., the distance along the outer surface of the housing) between the upper electrode 24 and the lower electrode 20.

The resin frame 14 is provided inside the housing 12 to support the plural semiconductor chips 10.

The heat compensation plate 18 is provided on the upper terminal 10a side of the semiconductor chip 10. The heat compensation plate 16 is provided on the lower terminal 10b side of the semiconductor chip 10. The heat compensation plates 16 and 18 are made of a material having a thermal expansion coefficient close to that of the semiconductor chip 10. When silicon is used for the semiconductor chip 10, an electrical conductor such as molybdenum can be used for the heat compensation plates 16 and 18.

The lower electrode 20 includes an electrode block 20a comprising an electrically conductive material and an annular fringe plate 20b. The fringe plate 20b is provided around the outer periphery of the electrode block 20a. The fringe plate 20b is thinner than the electrode block 20a. In other words, the thickness (the dimension in the Z direction) of the lower electrode 20 in the outer peripheral portion where the fringe plate 20b is present is smaller than the thickness of the lower electrode 20 in the central portion having the electrode block 20a. The electrode block 20a has a plurality of projections on the upper surface, and the heat compensation plate 16 and the semiconductor chips 10 are provided on the plural projections, respectively. The lower electrode 20 is electrically connected to the lower terminals 10b of the plural semiconductor chips 10 through the heat compensation plate 16.

The metal plate 22 comprises an electrically conductive material and is provided on the heat compensation plate 18. A projection 22a protrudes laterally and around the outer periphery of the main body of the metal plate 22. The main body of the metal plate 22 includes a plurality of projections extending from its bottom surface, and each projection is respectively positioned on a semiconductor chip 10 and connected to the heat compensation plates 18.

The upper electrode 24 is provided on the metal plate and includes an electrode block 24a comprising an electrically conductive material and an annular fringe plate 24b. The fringe plate 24b is provided around the outer periphery of the electrode block 24a. The fringe plate 24b is thinner than the electrode block 24a. In other words, the thickness of the upper electrode 24 in the outer peripheral portion having the fringe plate 24b is thinner in the z direction than the thickness of the upper electrode 24 in the central portion having the electrode block 24a. The upper electrode 24 is electrically connected to the upper terminals 10a of the semiconductor chips 10 through the heat compensation plates 18 and the metal plate 22.

The electrode blocks 20a and 24a and the metal plate 22 are made of, for example, copper.

The fringe plates 20b and 24b are made of, for example, iron nickel alloy.

The electrode block 20a is welded to the fringe plate 20b, and the electrode block 24a is welded to the fringe plate 24b.

The fringe plates 20b and 24b are respectively welded or brazed to the upper and lower end faces of the housing 12.

The plural semiconductor chips 10 are surrounded by the housing 12, the lower electrode 20, and the upper electrode 24. An inactive gas fills the interior space of the semiconductor device 100, to hermetically seal the plural semiconductor chips 10 therein.

The fringe plates 20b and 24b are formed in an annular plate shape and have a properly strong spring characteristic. When a pressing force is applied to the upper electrode 24 and the lower electrode 20 in the vertical (Z) direction of the semiconductor device, the semiconductor chips 10, the heat compensation plates 16, the heat compensation plates 18, the lower electrode 20, the metal plate 22, and the upper electrode 24 come into close contact with each other, hence to obtain a favorable electric contact condition therebetween.

Next, with reference to FIGS. 2 and 3, the details of the metal plate 22 will be described.

Figure 2:
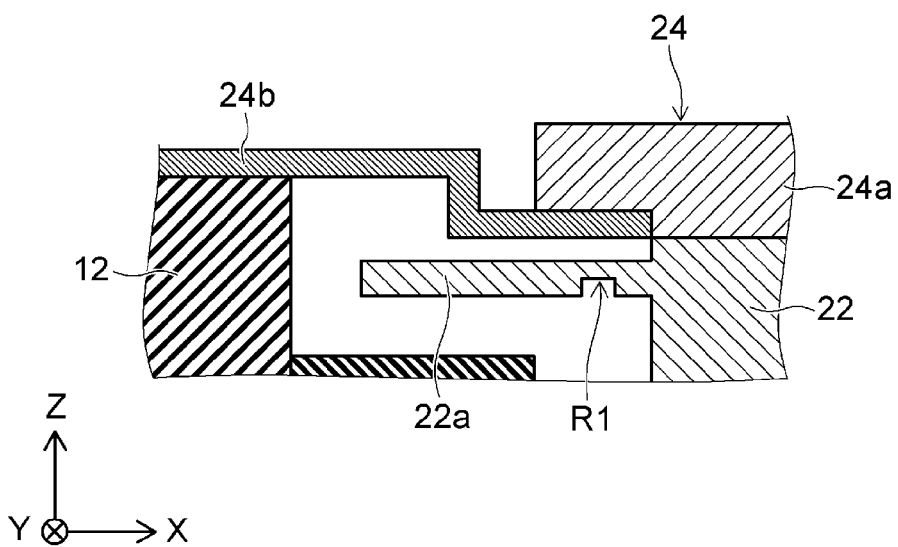
FIG. 2 is a cross-sectional view showing a part of the semiconductor device according to the embodiment.

FIG. 2 is a partial cross-sectional view of the semiconductor device 100 according to the embodiment.

Figure 3:
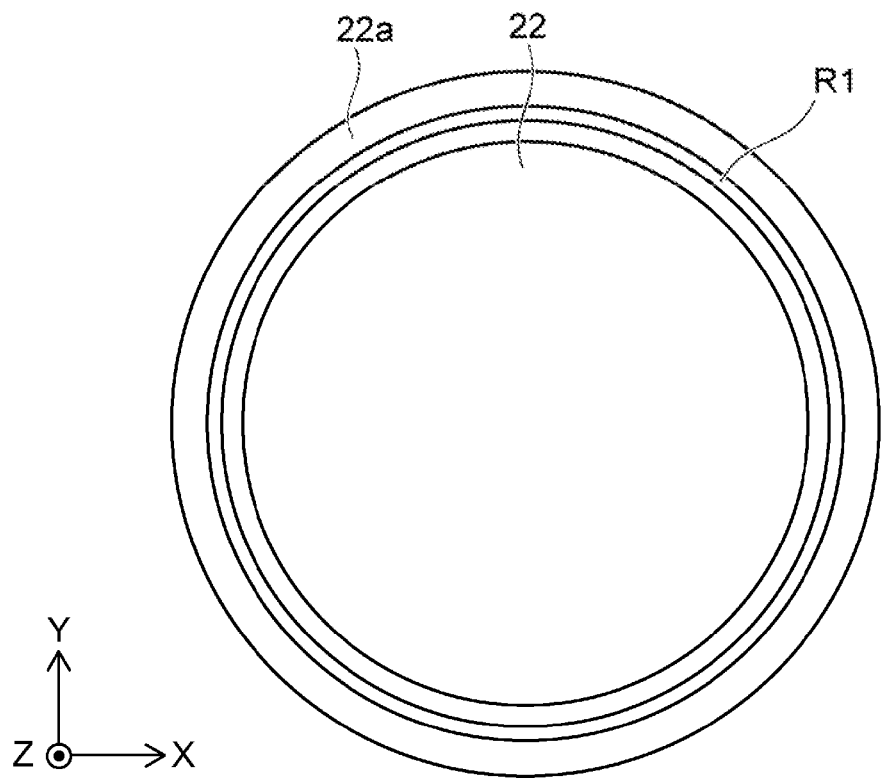
FIG. 3 is a top plan view of a metal plate provided in the semiconductor device according to the embodiment.

FIG. 3 is a top plan view of the metal plate 22 provided in the semiconductor device 100 according to the embodiment.

As mentioned above, the metal plate 22 has the projection 22a protruding laterally and circumferentially around its outer periphery. The projection 22a is spaced from the upper electrode 24 in the Z direction, as shown in FIG. 2. The projection 22a is also spaced from the inner wall surface of the housing 12.

The upper surface of the projection 22a faces at least a portion of the fringe plate 24b in the Z direction and extends below, in the z direction, the outer periphery of the electrode block 24a and the fringe plate 24b. In short, the projection 22a extends below at least a portion of the thin outer peripheral portion of the upper electrode 24.

A recess R1 is formed on the lower surface of the projection 22a facing the lower electrode 20 side of the device 100. The recess R1 extends inwardly of the lower surface of the projection 22a in an annular shape, i.e., the recess extends inwardly of the projection around the main portion 24a of the upper electrode 24 as shown in FIG. 3.

Here, the effects of the embodiment will be described.

In the semiconductor device 100, when some defect occurs in a one or more of the plurality of semiconductor chips 10 and a large current flows in a defective semiconductor chip 10, the temperature of the semiconductor chip 10 rises and thermal runaway occurs. When the thermal runaway further raises the temperature of the semiconductor chip 10, the semiconductor chip 10 starts melting. At this point, the semiconductor chip 10 may burst and the interior of the semiconductor device 100 may experience a rapid increase in pressure (burst pressure). Bursting of the semiconductor chip 10 causes pieces of the bursting chip to be ejected from the bursting chip location, which damages the housing 12, the lower electrode 20, and the upper electrode 24. Some of these pieces, including broken pieces of the upper and lower electrodes 20, 24, may be scattered out of the semiconductor device 100 to possibly damage a device other than the semiconductor device 100. Even when the semiconductor chip 10 bursts, it is preferable not to damage the semiconductor device 100 and not to scatter the broken pieces out of the semiconductor device 100.

The burst of the semiconductor chip 10 easily damages the semiconductor device 100 particularly in the thin outer periphery of the lower electrode 20 and the upper electrode 24 at the fringe plates 20b, 24b. That is because while the central portions of the lower electrode 20 and the upper electrode 24 (the electrode blocks 20a and 24a) are thicker and the thickness of the housing 12 is increased to improve the strength of the device, but the fringe plates 20b and 24b in the outer periphery of the lower electrodes 20 and the upper electrode 24 need to have a proper spring characteristic to ensure electrical contact with each of the semiconductor chips in the device 100.

In the semiconductor device 100 according to the embodiment, the metal plate 22 between the semiconductor chip 10 and the upper electrode 24 is provided with the projection 22a, and the projection 22a is spaced from the upper electrode 24. With this structure, when the broken pieces of the semiconductor chip 10 are scattered to the outer periphery of the upper electrode 24, they collide with the projection 22a. Since the projection 22a and the upper electrode 24 are spaced from each other in the Z direction, the impact when the broken pieces collide with the projection 22a can be prevented from being transmitting to the upper electrode 24. Further, even if the projection 22a is broken by the collision of the broken pieces, the projection 22a is bent upwardly, and the broken pieces collide with the upper electrode 24 with the kinetic energy of the broken pieces reduced by the collision(s) with the projection 22a and the body of the metal plate 22. Therefore, according to the embodiment, even when a semiconductor chip 10 bursts, the possibility of damaging the upper electrode 24 is reduced.

Further, the recess portion R1 formed in the projection 22a enhances the spring characteristic of the projection 22a to reduce the kinetic energy of the broken pieces more easily when the broken pieces collide with the projection 22a. Therefore, when the semiconductor chip 10 bursts, the possibility of damaging the upper electrode 24 can be further reduced.

The recess portion R1 may be formed on the upper surface of the projection 22a. However, it is preferably formed on the lower surface of the projection 22a. This is because by forming the recess portion R1 on the lower surface of the projection 22a, the spring characteristics of the projection 22a at a time of receiving a force from below is enhanced.

The recess portion R1 is not limited to the example shown in FIG. 3, but a plurality of the recess portions R1 may be provided in the projections 22a.

Modified Example

Figure 4:
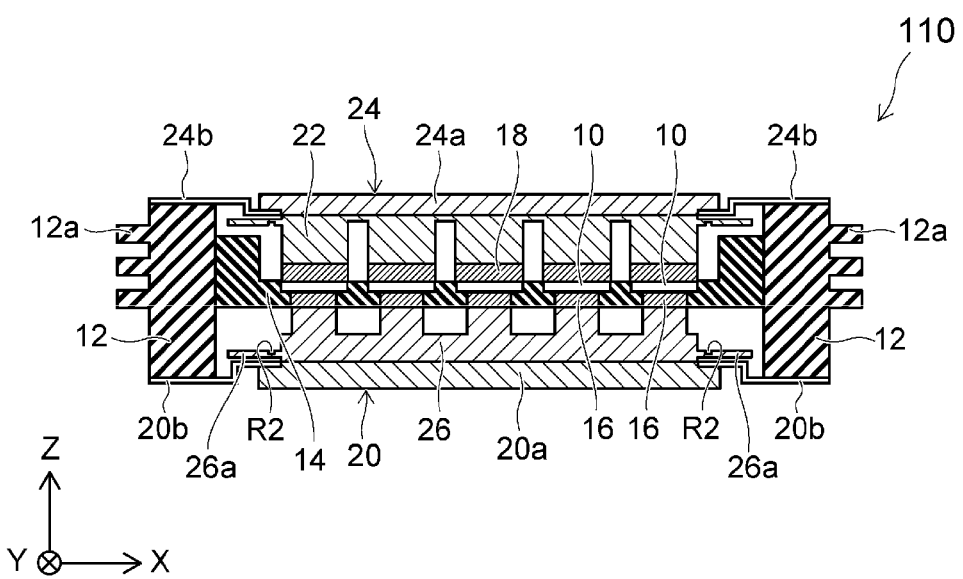
FIG. 4 is a cross-sectional view of a semiconductor device according to a modified example of the embodiment.

FIG. 4 is a cross-sectional view of a semiconductor device 110 according to a modified example of the embodiment.

Figure 1B:
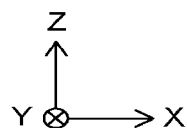

The semiconductor device 110 is different from the semiconductor device 100 in that a metal plate 26 similar in construct to metal plate 22 is provided between the plural semiconductor chips 10 and the lower electrode 20, and the lower electrode 20 has the same general construct as the upper electrode 24. In this modified example, the metal plate 26 also has the same general construct as the electrode 20 of the device 100 of FIG. 1, such that the metal plate can be considered as the second electrode and a conductive covering plate thereover as a third electrode. However, hereafter, the metal plate 26 is referred to as the second, or the lower, metal plate, and the conductive covering plate as the second electrode.

Metal plate 26 has a plurality of projections extending upwardly in the Z-direction on the upper surface thereof, and the heat compensation plates 16 and the semiconductor chips 10 are provided on the projections. The lower electrode 20 is electrically connected to the lower terminals 10b of the semiconductor chips 10 through the heat compensation plates 16 and the metal plate 26.

The metal plate 26 has a projection 26a (second projection) protruding laterally in its outer periphery, (circumferentially around the metal plate and in the x direction) similarly to that of the metal plate 22. The projection 26a is spaced from the lower electrode 20 in the Z direction. The projection 26a faces the fringe 20b of the lower electrode 20 in the Z direction and extends over the outer periphery of the electrode block 20a and the fringe 20b from above. In other words, the projection 26a extends over and thus covers at least apart of the thin outer peripheral portion of the lower electrode 20 from above.

Similarly to the projection 22a, a recess portion R2 is formed on the surface (upper surface) of the projection 26a on the upper electrode 24 side, and the recess portion R2 is formed along the outer periphery of the metal plate 26 in an annular shape.

The metal plate 26 located between the semiconductor chips 10 and the lower electrode 20 is provided with the projection 26a in this manner. Therefore, similarly to the case where the projection 22a is provided, even when the semiconductor chip 10 bursts, a possibility of damaging the lower electrode 20 is reduced.

Further, it is preferable that the recess portion R2 is also provided on the upper surface of the projection 26a. The recess portion R2 formed on the upper surface of the projection 26a can enhance the spring characteristic when being impacted by debris from above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. For example, the detailed structure of each element such as the semiconductor chip 10, the housing 12, the lower electrode 20, the metal plate 22, the upper electrode 24, and the metal plate 26 provided in the embodiments can be properly selected from the well known technique to those skilled in the art. The accompanying claims and their equivalents are intended to cover such forms or modifications as would fall within the scope and spirit of the inventions.

What is claimed is:

1. A semiconductor device comprising:
   at least one semiconductor element having a first terminal side and a second terminal side connected by an outer periphery portion, a first terminal on the first terminal side, and a second terminal on the second terminal side;
   a frame surrounding the outer periphery portion of the semiconductor element;
   a first electrode on the first terminal side electrically connected to the first terminal, the first electrode comprising a first body portion and a first projection protruding outwardly therefrom around the circumference of the first body portion;
   a second electrode on the second terminal side electrically connected to the second terminal; and
   a metal plate over the first electrode,
   wherein the first projection of the first electrode is spaced from and extends along a peripheral portion of the metal plate.

2. The semiconductor device according to claim 1, wherein the first projection comprises a first annular surface facing the second electrode and a second annular surface facing the metal plate, and
   wherein an annular recess extends inwardly of one of the first or second annular surfaces of the first projection.

3. The semiconductor device according to claim 2, wherein the annular recess extends inwardly of the first annular surface and around the first body portion of the first electrode.

4. The semiconductor device according to claim 2, wherein the metal plate comprises a first central body portion and an annular first fringe plate extending outwardly therefrom, and
   wherein the metal plate facing surface of the first projection extends between the first fringe plate and the second electrode.

5. The semiconductor device according to claim 4, further comprising a housing surrounding the frame, the housing comprising a first annular surface, and an opposed second annular surface, wherein the first fringe plate extends over, and is secured to, the first annular surface of the housing.

6. The semiconductor device according to claim 4, wherein the frame comprises a central region and an annular region extending therefrom in the direction of the first projection, wherein the annular region of the frame extends between the first fringe plate and the second electrode, and the first projection is spaced from the annular region of the frame.

7. The semiconductor device according to claim 1, wherein the second electrode comprises a second body portion and a second annular projection protruding outwardly therefrom around the circumference of the second body portion.

8. The semiconductor device according to claim 7, wherein the second projection comprises a third annular surface facing the first electrode and a fourth annular surface opposed to the first annular surface, and
wherein an annular recess is formed inwardly of one of the first and second annular surfaces of the second projection.

9. The semiconductor device according to claim 8, further comprising:
a housing surrounding the frame, the housing comprising a first annular surface, and an opposed second annular surface; and
a second metal plate on the second electrode, the second metal plate comprising a third portion and a fourth portion, thinner than the thickness of the third portion, extending therefrom around the periphery thereof, the fourth portion secured to the second annular surface of the housing.

10. The semiconductor device according to claim 9, wherein the second projection extends between a peripheral portion of the third portion of the second metal plate and the frame.

11. The semiconductor device according to claim 1, wherein the at least one semiconductor element includes a plurality of semiconductor chips, each of the plurality of semiconductor chips comprising a first terminal side and second terminal side, a first terminal located on the first terminal side thereof and a second terminal located on the second terminal side thereof, the first and second terminal sides connected by an outer periphery portion, wherein:
the first electrode is electrically connected to the plurality first terminals, and
the second electrode is electrically connected to the plurality of second terminals.

12. A semiconductor device, comprising:
an annular housing comprising a body having a first face, a second face, and an outer wall extending between the first face and the second face, the body surrounding a volume;
a frame in the volume and comprising a first surface and a second surface opposed to the first surface;
at least one semiconductor chip on the frame, the semiconductor chip having a first surface having a first terminal accessible thereon and a second surface;
a first conductor on the first surface side of the frame, the first conductor comprising a conductive first element comprising a first portion and a second portion, the second portion connected to the first face of the housing whereby the first portion is moveable with respect to the first face of the housing, and a second element disposed between the first element and the frame, the second element comprising a first portion and a second portion surrounding the first portion, the second portion of the second element having a thickness thinner than the first portion of the second element, the second portion of the second element extending between a portion of the frame and the second portion of the first element; and a second conductor on the second side of the frame, the second conductor comprising a first portion and a second portion, the second portion of the second conductor connected to the second face of the housing and the first portion of the second conductor moveable with respect to the second face of the housing.

13. The semiconductor device according to claim 12, wherein the second conductor further comprises a conductive first element comprising the first portion and a second portion.

14. The semiconductor device of claim 13, wherein the second conductor further comprises a second element between the first element of the second conductor and the frame, the second element comprising a first portion and a second portion surrounding the first portion, the second portion of the second element having a thickness thinner than the first portion of the second element, the second portion of the second element extending between a portion of the frame and the second portion of the first element.

15. The semiconductor device according to claim 13, wherein the second portion of the second element of the first conductor comprises an annular recess extending into a surface thereof.

16. The semiconductor device according to claim 15, wherein the second portion of the second element of the first conductor comprises a first surface facing the periphery of the first element of the first conductor and a second surface facing the frame, and the annular recess extends inwardly of the second surface of the second portion of the second element of the first conductor.

17. A semiconductor device, comprising:
an annular housing comprising a body having a first face, a second face, and an outer wall extending between the first face and the second face, the body surrounding a volume;
a frame located in the volume and comprising a first surface and a second surface opposed to the first surface;
at least one semiconductor chip on the frame, the semiconductor chip having a first surface having a first terminal accessible thereon and a second surface;
a first conductor on the first surface side of the frame, the first conductor comprising a conductive first element comprising a first portion and a second portion, the second portion connected between the first surface of the housing and the first portion, whereby the first portion is moveable with respect to the first surface of the housing, and a second element disposed between the first element and the frame, the second element comprising a first portion and a second portion surrounding the first portion, the second portion of the second element having a thickness thinner than the first portion of the second element, the second portion of the second element extending between a portion of the frame and the periphery of the first portion of the first element and at least a portion of the second portion of the first element; and
a second conductor on the second surface side of the frame, the second conductor comprising a first element having a first portion and a second portion connected to the second surface of the housing and the first portion of the first element of the second conductor moveable with respect to the second face of the housing.

18. The semiconductor device according to claim 17, wherein the second conductor further comprises a conductive second element disposed between the first element of the second conductor and the frame, the second element comprising a first portion and a second portion surrounding the first portion, the second portion of the second element having a thickness thinner than the first portion of the second element, the second portion of the second element extending between a portion of the frame and the second portion of the first element.

19. The semiconductor device according to claim 17, further comprising a first heat compensation plate between the first conductor and the frame, the heat compensation plate having a coefficient of thermal expansion similar to that of the semiconductor chip.

20. The semiconductor device according to claim 19, further comprising a second heat compensation plate between the second conductor and the frame, the heat compensation plate having a coefficient of thermal expansion similar to that of the semiconductor chip.

* * * * *